United States Patent [19]
Zeitraeg

[11] Patent Number: 4,500,869
[45] Date of Patent: Feb. 19, 1985

[54] METHOD FOR CONVERSION OF LINEARLY ENCODED INTO NON-LINEARLY ENCODED DIGITAL SIGNALS

[75] Inventor: Rolf Zeitraeg, Munich, Fed. Rep. of Germany

[73] Assignee: Siemens Aktiengesellschaft, Munich, Fed. Rep. of Germany

[21] Appl. No.: 178,531

[22] Filed: Aug. 15, 1980

[30] Foreign Application Priority Data

Sep. 26, 1979 [DE] Fed. Rep. of Germany ....... 2938984

[51] Int. Cl.$^3$ ............................................ H03K 13/24
[52] U.S. Cl. ............................................ 340/347 DD
[58] Field of Search ................. 340/347 DD; 235/310; 364/722

[56] References Cited

U.S. PATENT DOCUMENTS 3,694,639 9/1972 Deschenes ................... 340/347 DD

FOREIGN PATENT DOCUMENTS 2312128 9/1974 Fed. Rep. of Germany ...... 235/310
615486 6/1978 U.S.S.R. ............................. 364/722

Primary Examiner—Charles D. Miller
Attorney, Agent, or Firm—Karl F. Milde, Jr.

[57] ABSTRACT

A technique for converting linearly encoded digital signals into non-linearly encoded digital signals using two separate ROMs.

8 Claims, 2 Drawing Figures

| V | $2^{11}$ | $2^{10}$ | $2^9$ | $2^8$ | $2^7$ | $2^6$ | $2^5$ | $2^4$ | $2^3$ | $2^2$ | $2^1$ | $2^0$ | |
|---|---|---|---|---|---|---|---|---|---|---|---|---|---|
| L | L | d | c | b | a | x | x | x | x | x | x | x | x | 7 |
| L | 0 | L | d | c | b | a | x | x | x | x | x | x | x | 6 |
| L | 0 | 0 | L | d | c | b | a | x | x | x | x | x | x | 5 |
| L | 0 | 0 | 0 | L | d | c | b | a | x | x | x | x | x | 4 |
| L | 0 | 0 | 0 | 0 | L | d | c | b | a | x | x | x | x | 3 |
| L | 0 | 0 | 0 | 0 | 0 | L | d | c | b | a | x | x | x | 2 |
| L | 0 | 0 | 0 | 0 | 0 | 0 | L | d | c | b | a | x | x | 1 |
| L | 0 | 0 | 0 | 0 | 0 | 0 | 0 | L | d | c | b | a | x | 0 |

| V | $2^6$ | $2^5$ | $2^4$ | $2^3$ | $2^2$ | $2^1$ | $2^0$ |
|---|---|---|---|---|---|---|---|
| L | L | L | L | d | c | b | a |
| L | L | L | 0 | d | c | b | a |
| L | L | 0 | L | d | c | b | a |
| L | L | 0 | 0 | d | c | b | a |
| L | 0 | L | L | d | c | b | a |
| L | 0 | L | 0 | d | c | b | a |
| L | 0 | 0 | L | d | c | b | a |
| L | 0 | 0 | 0 | d | c | b | a |

METHOD FOR CONVERSION OF LINEARLY ENCODED INTO NON-LINEARLY ENCODED DIGITAL SIGNALS

BACKGROUND OF THE INVENTION

The present invention relates to a method for conversion of linearly encoded digital signals into non-linearly encoded digital signals according to a multiple segment characteristic obeying the A law or the $\mu$ law. This A law and $\mu$ law are well known in the art of handling pulse code modulated (PCM) signals in telephone systems.

When samples of analog signals obtained by periodic sampling are converted into digital signals in the form of PCM words, the analog values which fall within a continuous amplitude range must be correlated to a limited number of amplitude levels because of the limited number of coding digits used. Hence, a so-called "quantization" takes place. As a consequence of such quantization, quantization noise results. To ensure that this quantization noise will not be noticeable as a disturbance, it is necessary to maintain a certain ratio of analog signal amplitude to the quantization-caused interference amplitude.

When using 4000 amplitude levels uniformly distributed over the total amplitude range of the analog signals, it would indeed be possible to obtain an adequate signal-to-noise ratio. It would then be necessary, however, to transmit digital signals having at least twelve code character elements or digits. Furthermore, with such a uniform level distribution the S/N ratio would be unnecessarily high in the range of high analog value amplitudes. In the course of encoding, therefore, a so-called "companding" is carried out; that is, the linear code representation is converted to a non-linear code representation in such a way that the signal-to-noise ratio is constant over the entire amplitude range. An exactly constant signal-to-noise ratio results in a logarithmic companding characteristic. In practice one operates according to companding characteristics that are easy to realize and which obey the so-called A law or the so-called $\mu$ law. When using the A law, one operates according to a characteristic which is composed of thirteen rectilinear segments; with the $\mu$ law, there are fifteen segments. The slope of the line of these characteristics decreases in each of the two half-planes from segment to segment by a factor of 2. Each segment, in turn, is divided into sixteen quantization steps of equal size, whose height increases from segment to segment by a factor of 2. This regularity is interrupted in the first segment. When taking the A law as a basis, the first segment contains 32 positive and 32 negative quantization steps, each encompassing two values of the linearly encoded information. In the $\mu$ law the first segment is divided into fifteen positive and fifteen negative quantization steps, likewise encompassing two values of linearly encoded signals, as well as into a positive and a negative quantization step encompassing only one value of the linearly encoded signal. Thus in the A law 8192 steps in linear encode representation are correlated with 256 steps in companded representation. In the $\mu$ law the ratio of linearly encoded steps to non-linearly encoded steps is 16318 to 256.

If the mentioned correlation of linearly encoded signal values to non-linearly encoded signal values is effected with the aid of a memory, on the basis of the A law $2^{13}$, and on the basis of the $\mu$ law $2^{14}$ addresses are needed to activate the 256 possible non-linearly encoded signal values. Because of the eight bits required for non-linear code representation, this means a memory capacity in the first case of $2^{16}$, and in the second case of $2^{17}$ bits or, in other words, 64K bits and 128K bits, respectively. When using quantity-produced, integrated semiconductor memories of suitable size, in particular those with 512 storage places of eight bits each and this a storage capacity of 4K bits, it is necessary to provide sixteen or, respectively, thirty-two such memories, each having twenty connections. However, this large number of required connections for all the memories is undesirable in practice and expensive.

SUMMARY OF THE INVENTION

It is therefore an object of the present invention to provide a method for converting linearly encoded digital signals into non-linearly encoded digital signals which permits the use of smaller memories and less memory connections than has been possible heretofore.

This object, as well as other objects which will become apparent from the discussion that follows, are achieved, according to the present invention, with the aid of two memories. To the first memory are supplied at least as many higher order bits of the linearly encoded signal value as are necessary to identify the segment of the characteristic into which the respective signal value falls. A plurality of digital words are stored in this first memory. The highest order bits of these words form the highest order bits of the corresponding non-linearly encoded signal value, following the sign bits, which indicate the segment of the characteristic in which this signal value lies. The remaining bits of the digital words represent a first partial address for activating the second memory. A second, lower order partial address for this second memory is obtained from the remaining bits, with the exception of the lowest order bit which is disregarded in the conversion, of the respective linearly encoded signal value. This second memory stores bit combinations which identify the corresponding levels of the segments of the characteristic to which the non-linearly encoded signal values belong. The non-linearly encoded signal values thus comprise, in successive order, the highest order bit of the linearly encoded signal values, the mentioned three highest order bits read from the first memory, and the bit combinations read from tne second memory.

For a full understanding of the present invention, reference should now be made to the following detailed description of one preferred embodiment of the invention and to the accompanying drawing.

DESCRIPTION OF THE PREFERRED EMBODIMENT

Figures 1, 2:
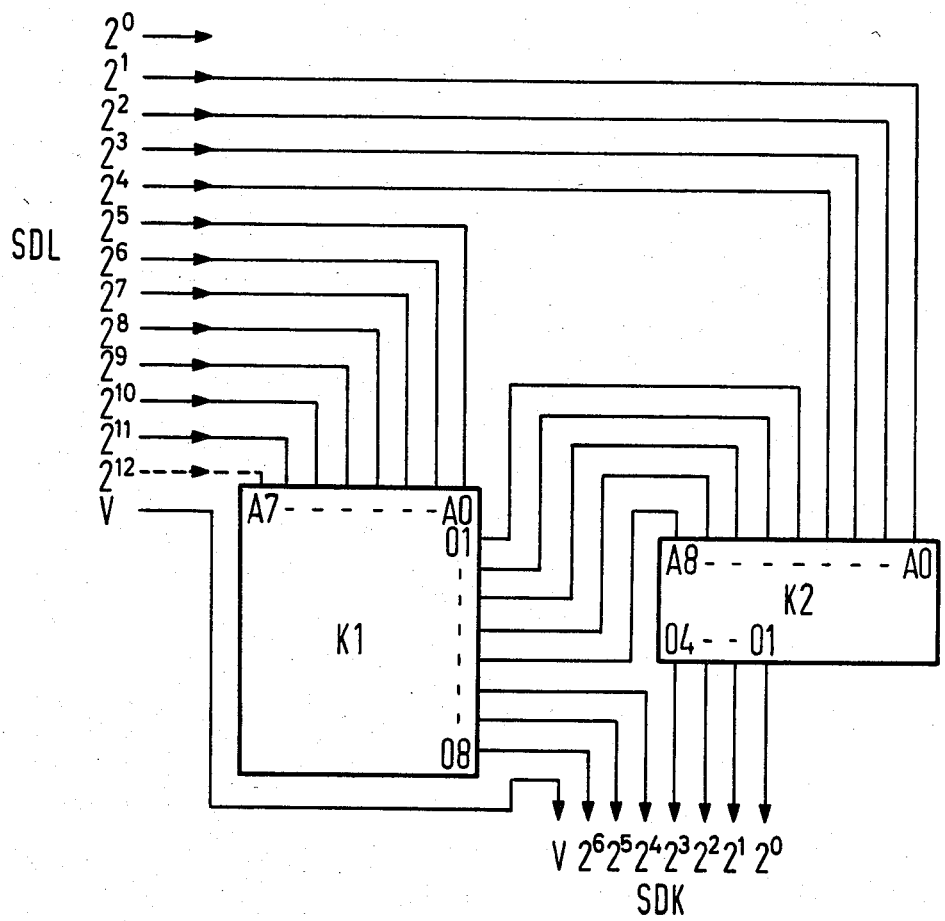
FIG. 1 provides a comparison of a code table of linearly encoded signal values and a code table of correlated non-linearly encoded signal values.
FIG. 2 is a schematic diagram of an arrangement of two memories with their associated address and output lines, as used for carrying out the method of the invention.

The preferred embodiment of the invention will now be described with reference to FIGS. 1 and 2 of the drawing. The tables shown in FIG. 1 provide a comparison of the use of thirteen bits of linearly encoded digital signals with the use of eight bits of the corresponding non-linearly encoded digital signals, the represented relationship obeying the aforementioned A law. The conditions are only shown in the positive half of the 13-segment characteristic. For the negative half the same representation applies, with the only difference that the highest-order bit, $2^{12}$ in the linear representation or $2^7$ in the non-linear representation, has the binary value 0 instead of the binary value L. The numbers 0 to 7 entered between the two code word groups indicate that the respective lines relate to the segments 0 to 7 of the characteristic half. It should be mentioned here that the complete characteristic is actually composed of thirteen straight lines.

As the non-linear code representation in the right-hand portion of the figure shows, all segments 0 to 7 are divided into sixteen levels of equal size, corresponding to the sixteen possible different combinations a,b,c,d, of the four lowest order bits $2^0$ to $2^3$. The three lower order bits $2^6$ to $2^4$ after the highest order bit $2^7$, which indicates the sign, assume from segment 0 to segment 7 the combinations 000 to LLL and thus constitute the segment address.

From a comparison of the two kinds of code representations, and in particular those which concern the segment 0, one can see that the binary value of the lowest-order bit $2^0$ of the linear code representation is without influence on the corresponding non-linearly represented code word, which means that one level in the non-linear code representation comprises at least two linearly encoded signal values. According to one characteristic feature of the invention, therefore, this lowest order bit is disregarded in the conversion from one type of code representation to the other. The comparison of the two code tables shows, moreover, that in segment 0 and in segment 1, in accordance with the possible bit combinations a,b,c,d, $16 \times 2$ linear steps correspond to 16 steps in the non-linear code representation. It shows further that in ascending from segment 2 to segment 7 the quantization steps increase by a factor of 2: that is, in segment 2 the sixteen non-linearly encoded code values are correlated with four linearly encoded code values, which differ in the combination possibilities of the bits $2^0$ and $2^1$; in segment 3 the sixteen non-linearly encoded code values are correlated with eight linearly encoded code values which differ by the combination possibilities of the bits $2^0$ to $2^7$, etc.; and in segment 7 the sixteen non-linearly represented code values are correlated with 128 linearly encoded code values corresponding to the combination possibilities of the bits $2^0$ to $2^6$.

The arrangement shown in FIG. 2 for the practice of the rethod of the invention includes two memories K1 and K2, which may be read-only memories (ROMs) or programmable read-only memories (PROMs).

Of the linearly encoded signals SDL to be converted (which, if the $\mu$ law is taken as basis, are formed by fourteen bits $2^0$ to $2^{12}$ plus the sign bit V and, if the A law is taken as a basis, are formed by thirteen bits $2^0$ to $2^{11}$ and the sign bit V) as many higher order bits following the highest order bit V are supplied as an address to the memory K1 as are necessary to identify the segment of the characteristic into which the respective signal value falls. Taking as basis the A law, to which reference is made in the following explanation, these are the bits $2^{11}$ to $2^5$ as the code table for linear representation in FIG. 1 shows, since only with the inclusion of all these bits it can be established which positions are occupied by the bits a, b, c, d indicating the level limits in the individual segments. Except for the segments 0 and 1, these bits a, b, c and d encompass bits $2^1$ to $2^{10}$, differing from segment to segment.

For conversion according to the A law, therefore, the first memory K1 includes $2^7 = 128$ memory cells. For conversion according to the $\mu$ law this memory has $2^8 = 256$ memory cells.

In these cells are stored, in corresponding correlation, digital words whose three highest order bits are the highest order bits—with the exception of the sign bit—of the corresponding non-linearly encoded signal SDK which, as explained above, indicate the segment of the characteristic on which the signal value lies. The remaining bits of the mentioned digital words, in this case five, form a sub-address for activation of the second memory K2. The mentioned memory cells of the first memory K1 therefore offer storage space for eight bits each, so that the total storage volume based on the A law is 1024 bits.

The sub-address readable from the first memory K1 for the second memory K2 represents the higher order portion of the latter's addresses. The lower order portion of its addresses is provided by the remaining bits with the exception of the lowest order bit, of the linearly encoded signals, or in this case the bits $2^1$ to $2^4$.

Since these addresses of the memory K2 comprise nine bits, it is possible to access the 512 memory cells within the memory. These cells store bit combinations which mark the corresponding levels of the segments of the characteristic to which the individual non-linearly encoded signal values are correlated. As noted above in connection with FIG. 1, these bit combinations comprise four bits, so that the storage volume of the second memory K2 is $512 \times 4 = 2048$ bits.

As explained above, if a single programmable memory is used for code conversion, this memory would have to have a storage capacity of 64K bits in the case of the A law. In comparison, if the method of the present invention is employed, only 3072 bits of memory storage are required.

As shown in FIG. 2, the sign bits of the linearly encoded signals are used directly for the formation of the non-linearly encoded digital signals as the highest order bit and hence the sign bit. The three above-mentioned bits $2^6$ to $2^4$, readable from the first memory K1, are used is bits of the next following order and hence as bits representing the segment address. Finally the four bits $2^3$ to $2^0$, readable from the second memory K2, are used as lowest-order bits. The lowest-order bit $2^0$ of the linearly encoded digital signals is disregarded for the above mentioned reasons.

There has thus been shown and described a novel code conversion method which fulfills all the objects and advantages sought therefore. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are intended to be covered by the invention which is limited only by the claims which follow.

What is claimed is:

1. A method for converting a linearly encoded digital signal (SDL) into a non-linearly encoded digital signal (SDK) in accordance with a multiple segment characteristic obeying the A law or the μ law, said digital signals SDL and SDK having a sign bit (V) in the highest order position, said method comprising the steps of:

(a) supplying to a first memory (K1), as an address, at least as many higher order bits of said signal SDL, exclusive of the said sign bit V, as are necessary for identifying the segment of the characteristic into which the respective signal value falls, said first memory having stored therein a plurality of first digital words, each having a first plurality of bits defining the highest order bits of the corresponding signal SDK following the sign bit V which indicate the segment of the characteristic on which this signal value lies, plus a second plurality of bits defining a partial memory address;

(b) supplying to a second memory (K2), as a first partial address, said second plurality of bits;

(c) supplying to said second memory K2, as a second partial address, the lower order bits of said signal SDL, exclusive of the lowest order bit which is disregarded in the conversion, said second memory having stored therein a plurality of second digital words which identify the corresponding levels of the segments of the characteristic to which the values of said signal SDK are correlated;

(d) presenting the sign bit V of said signal SDL as the highest order bit of said signal SDK;

(e) reading said first plurality of bits from said memory K1 as the next highest order bits of said signal SDK; and (f) reading said second digital words from said memory K2 as the lowest order bits of said signal SDK.

2. The method recited in claim 1, wherein said first plurality of bits is three bits.

3. The method recited in claim 1, wherein said second plurality of bits is five bits.

4. The method recited in claim 1, wherein said second digital words are four bits in length.

5. Apparatus for converting a linearly encoded digital signal (SDL) into a non-linearly encoded digital signal (SDK) in accordance with a multiple segment characteristic obeying the A law or the μ law, said digital signals SDL and SDK having a sign bit (V) in the highest order position, said apparatus comprising, in combination:

(a) a plurality of input terminals for receiving said signal SDL;

(b) a first memory (K1) having a plurality of first address inputs and a plurality of first memory outputs, said first address inputs being connected to said input terminals to receive at least as many higher order bits of saic signal SDL, exclusive of the said sign bit V, as are necessary for identifying the segment of the characteristic into which the respective signal value falls, said first memory K1 having stored therein a plurality of first digital words, each having a first plurality of bits defining the highest order bits of the corresponding signal SDK, following the sign bit V, which indicate the segment of the characteristic on which this signal value lies, plus a second plurality of bits defining a partial memory address;

(c) a second memory (K2) having a plurality of second address inputs and a plurality of second memory outputs, said second address inputs being connected to said first memory outputs to receive, as a first partial address, said second plurality of bits and being connected to said input terminals to receive, as a second partial address, the lower order bits of said signal SDL, exclusive of the lowest order bit which is disregarded in the conversion, said second memory K2 having stored therein a plurality of second digital words whicn identify the corresponding levels of the segments of the characteristic to which the values of said signal SDK are correlated;

(d) a plurality of output terminals for presenting said signal SDK, said output terminals including:
  (1) a first output terminal connected to one of said input terminals ro receive said sign bit V of said signal SDL as the highest order bit of said signal SDK;
  (2) a plurality of second output terminals connected to said first memory outputs to receive said first plurality of bits from said memory K1 as the next highest order bits of said signal SDK; and
  (3) a plurality of third output terminals connected to said second memory outputs to receive said second digital words from said memory K2 as the lowest order bits of said signal SDK.

6. The apparatus recited in claim 5, wherein said first plurality of bits is three bits.

7. The apparatus recited in claim 5, wherein said second plurality of bits is five bits.

8. The apparatus recited in claim 5, wherein said second digital words are four bits in length.

* * * * *